United States Patent
Kim et al.

(10) Patent No.: US 7,329,959 B2
(45) Date of Patent: Feb. 12, 2008

(54) MICRO POWER GENERATOR AND APPARATUS FOR PRODUCING RECIPROCATING MOVEMENT

(75) Inventors: Kwang Ho Kim, Seoul (KR); Gwi Eun Song, Gwacheon-si (KR); Jae Hak Jeon, Seoul (KR); Yoon Pyo Lee, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 3 days.

(21) Appl. No.: 11/365,950

(22) Filed: Feb. 27, 2006

(65) Prior Publication Data

US 2006/0278263 A1   Dec. 14, 2006

(30) Foreign Application Priority Data

Jun. 10, 2005   (KR) .................. 10-2005-0049617

(51) Int. Cl.
*B60L 1/02* (2006.01)
*F01K 15/00* (2006.01)
*F01K 17/02* (2006.01)
*F02C 6/00* (2006.01)
*F02C 6/18* (2006.01)

(52) U.S. Cl. .............. 290/2; 60/512; 60/513; 60/514; 60/515; 60/517; 290/1 R

(58) Field of Classification Search ............ 290/2, 290/1 R; 60/512–515, 517
See application file for complete search history.

(56) References Cited

U.S. PATENT DOCUMENTS

| | | | | |
|---|---|---|---|---|
| 3,508,974 A | * | 4/1970 | Bressler | 136/205 |
| 3,846,984 A | * | 11/1974 | Siegel | 60/512 |
| 4,027,479 A | * | 6/1977 | Cory | 60/527 |
| 4,044,558 A | * | 8/1977 | Benson | 60/520 |
| 4,463,214 A | * | 7/1984 | Lowther | 136/208 |
| 4,511,805 A | * | 4/1985 | Boy-Marcotte et al. | 290/2 |
| 4,733,121 A | * | 3/1988 | Hebert | 310/311 |
| 5,146,750 A | * | 9/1992 | Moscrip | 60/517 |

(Continued)

FOREIGN PATENT DOCUMENTS

KR   2003-58420   7/2003

(Continued)

*Primary Examiner*—Darren Schuberg
*Assistant Examiner*—Pedro J. Cuevas
(74) *Attorney, Agent, or Firm*—Jones Day

(57) ABSTRACT

There is provided a micro power generator enhanced in efficiency and power generation output, and having an increased temperature range for operation. The micro power generator comprises: a high-temperature heat source; a low-temperature heat source; an enclosed body containing a working substance therein, the enclosed body being deformable by means of a phase change of the working substance between a first shape wherein heat can be transferred from the high-temperature heat source and a second shape wherein heat can be transferred to the low-temperature heat source; a permanent magnet constituting the enclosed body, the permanent magnet being maintained in a first position when the enclosed body has the first shape and in a second position when the enclosed body has the second shape; and a wire in which an electric current is induced by a movement of the permanent magnet. Further, the present invention provides an apparatus for producing a reciprocating movement between two heat sources having a temperature difference therebetween.

12 Claims, 6 Drawing Sheets

U.S. PATENT DOCUMENTS

| | | | | |
|---|---|---|---|---|
| 5,251,448 A * | 10/1993 | Rodger | ................ | 62/6 |
| 5,329,768 A * | 7/1994 | Moscrip | ................ | 60/518 |
| 5,367,878 A * | 11/1994 | Muntz et al. | ................ | 60/512 |
| 6,109,222 A * | 8/2000 | Glezer et al. | ................ | 123/46 R |
| 6,226,990 B1 * | 5/2001 | Conrad | ................ | 60/520 |
| 6,269,639 B1 * | 8/2001 | Conrad | ................ | 60/515 |
| 6,269,640 B1 * | 8/2001 | Conrad | ................ | 60/520 |
| 6,276,313 B1 * | 8/2001 | Yang et al. | ................ | 123/46 E |
| 6,279,319 B1 * | 8/2001 | Conrad | ................ | 60/520 |
| 6,286,310 B1 * | 9/2001 | Conrad | ................ | 60/520 |
| 6,293,101 B1 * | 9/2001 | Conrad | ................ | 60/520 |
| 6,311,491 B1 * | 11/2001 | Conrad | ................ | 60/520 |
| 6,345,666 B1 * | 2/2002 | Conrad | ................ | 165/154 |
| 6,385,972 B1 * | 5/2002 | Fellows | ................ | 60/517 |
| 6,637,211 B1 * | 10/2003 | Swift et al. | ................ | 62/6 |
| 6,643,132 B2 * | 11/2003 | Faneuf et al. | ................ | 361/700 |
| 6,668,911 B2 * | 12/2003 | Bingler | ................ | 165/80.4 |
| 6,701,708 B2 * | 3/2004 | Gross et al. | ................ | 60/517 |
| 6,725,668 B1 * | 4/2004 | Cornwall | ................ | 62/3.1 |
| 6,725,670 B2 * | 4/2004 | Smith et al. | ................ | 62/6 |
| 6,745,823 B2 * | 6/2004 | Brost | ................ | 165/80.4 |
| 6,755,026 B2 * | 6/2004 | Wallach | ................ | 62/3.7 |
| 6,758,040 B1 * | 7/2004 | Cantu | ................ | 60/508 |
| 6,760,221 B2 * | 7/2004 | Goth et al. | ................ | 361/699 |
| 6,760,222 B1 * | 7/2004 | Wang | ................ | 361/700 |
| 6,789,611 B1 * | 9/2004 | Li | ................ | 165/104.29 |
| 6,792,764 B2 * | 9/2004 | Poese et al. | ................ | 62/6 |
| 6,799,428 B1 * | 10/2004 | Stollenwerk | ................ | 62/3.7 |
| 6,799,628 B1 * | 10/2004 | Masseth et al. | ................ | 165/80.4 |
| 6,804,114 B1 * | 10/2004 | Greer | ................ | 361/687 |
| 6,809,427 B2 * | 10/2004 | Cheung et al. | ................ | 290/1 R |
| 6,812,583 B2 * | 11/2004 | Cheung et al. | ................ | 290/1 R |
| 6,856,037 B2 * | 2/2005 | Yazawa et al. | ................ | 290/43 |
| 6,910,332 B2 * | 6/2005 | Fellows | ................ | 60/520 |
| 6,978,610 B2 * | 12/2005 | Carnahan | ................ | 60/495 |
| 6,978,611 B1 * | 12/2005 | Landis | ................ | 60/513 |
| 7,012,554 B2 * | 3/2006 | Hiller et al. | ................ | 340/988 |
| 7,055,332 B2 * | 6/2006 | Poese et al. | ................ | 62/6 |
| 7,081,684 B2 * | 7/2006 | Patel et al. | ................ | 290/1 R |
| 7,081,699 B2 * | 7/2006 | Keolian et al. | ................ | 310/311 |
| 7,109,597 B1 * | 9/2006 | Bose | ................ | 290/43 |
| 7,143,586 B2 * | 12/2006 | Smith et al. | ................ | 62/6 |
| 7,152,404 B2 * | 12/2006 | Francois et al. | ................ | 60/525 |
| 2002/0148237 A1 * | 10/2002 | Thiesen et al. | ................ | 62/6 |
| 2003/0098588 A1 * | 5/2003 | Yazawa et al. | ................ | 290/43 |
| 2003/0121259 A1 * | 7/2003 | Conrad | ................ | 60/508 |
| 2004/0155467 A1 * | 8/2004 | Cheung et al. | ................ | 290/1 R |
| 2005/0091974 A1 * | 5/2005 | Carnahan | ................ | 60/517 |
| 2006/0119224 A1 * | 6/2006 | Keolian et al. | ................ | 310/339 |
| 2007/0090723 A1 * | 4/2007 | Keolian et al. | ................ | 310/311 |

FOREIGN PATENT DOCUMENTS

KR      2003-93663      12/2003

* cited by examiner

MICRO POWER GENERATOR AND APPARATUS FOR PRODUCING RECIPROCATING MOVEMENT

FIELD OF THE INVENTION

The present invention generally relates to a micro power generator, and more particularly to a micro power generator adapted to convert thermal energy into electric energy in order to supply electrical power to a micro electro-mechanical system (hereinafter referred to as "MEMS") and the like. Further, the present invention relates to an apparatus for producing reciprocable movement between two heat sources having a temperature difference therebetween.

BACKGROUND OF THE INVENTION

Generally, MEMS is provided with a plurality of components, which consume electrical power, such as a micro sensor, a micro actuator, a micro-pump, a microprocessor and the like. These components can be installed in a restricted space due to their micro-scale size. Although such components can be driven with a very small quantity of electrical power (compared to that of a macro system), it is necessary to supply a stable electrical power for reliable operations of the components.

A large capacity battery or a micro fuel cell can be used as a power source for supplying power to the MEMS. However, such battery or fuel cell needs to be replaced with a new one after a predetermined period of time. In addition, when the MEMS requires only low power consumption or is used as a disposable device, a self-generation type generator, which is inexpensive and does not require the use of a battery, may be employed. Specifically, a typical self-generation type generator includes a generator adapted to use a temperature difference between high and low temperatures, a generator based on Seebeck effect and the like. Such type of generator is superior compared to the power source comprising a battery or fuel cells.

One example of a generator, which is based on the Seebeck effect, is a micro power generator comprising a thermoelectric module.

Among the self-generation type generators, one example of the generator that uses the temperature difference is disclosed in Korean Patent Laid-Open Publication No. 2003-0058420, which was filed by the applicant of the present invention. Such laid-open publication discloses that a membrane compresses a piezoelectric material through the expansion of fluid contacting a heat source, thereby generating electrical currents. Also, a closed-loop type micro generator is disclosed in Korean Patent Laid-Open Publication No. 2003-0093663, which was also filed by the applicant of the present invention. In such laid-open publication, a magnet is moved in a coil by means of fluid, which circulates in a close-loop micro channel and is boiled or condensed by a temperature difference. However, although various types of generators as mentioned above have been continuously developed and introduced, such conventional generators are deficient in that they have low efficiency and output in terms of power generation, and can only typically operate within restricted temperature ranges and circumstances.

SUMMARY OF THE INVENTION

Therefore, it is an object of the present invention to provide a micro power generator, which has enhanced efficiency and output in terms of power generation, as well as an increased temperature range for operation.

It is another object of the present invention to provide an apparatus for producing reciprocating movement, which is reciprocably moved between two heat sources having a temperature difference therebetween.

Consistent with the foregoing objects and in accordance with the invention as embodied broadly herein, there is provided a micro power generator, comprising: a high-temperature heat source; a low-temperature heat source; an enclosed body containing a working substance therein, the enclosed body being deformable by means of a phase change of the working substance between a first shape wherein heat can be transferred from the high-temperature heat source and a second shape wherein heat can be transferred to the low-temperature heat source; a permanent magnet constituting the enclosed body, the permanent magnet being maintained in a first position when the enclosed body is in the first shape and in a second position when the enclosed body is in the second shape; and a wire wherein an electrical current is induced due to a movement of the permanent magnet.

In the micro power generator as described above, the working substance, which undergoes the phase change during heat transfer between two heat sources having a temperature difference therebetween, deforms the enclosed body between the first shape wherein heat can be transferred from the high-temperature heat source and the second shape wherein heat can be transferred to the low-temperature heat source. Then, the permanent magnet provided with the enclosed body is moved by the deformation of the enclosed body between the first position wherein heat can be introduced from the high-temperature heat source and the second position wherein heat can be transferred to the low-temperature heat source. As a result, a magnetic flux density around the wire is changed and an electrical current can be induced in the wire.

The enclosed body comprises a membrane movable in a manner of a bi-stable behavior and liquid-tightly coupled to the permanent magnet. Preferably, the bi-stable behavior of the membrane is formed by means of the phase change of a volume increase or volume decrease of the working substance.

More specifically, the enclosed body is restrictedly deformed between the first and second shapes by the membrane, which is movable in the manner of the bi-stable behavior so as to become stabilized in one of two stable states. Correspondingly, the permanent magnet is restrictedly moved between the first and second positions. The permanent magnet is moved between such restricted positions by the membrane recovering from its stable state. Thus, the surrounding magnetic flux density is changed and an electrical current can be induced in the wire, thereby causing power generation. Particularly, the working substance contained in the enclosed body undergoes a phase change causing a volume increase by means of the heat transferred thereto or a phase change causing a volume decrease by means of the heat discharged therefrom. This is so that the increase and decrease in volume of the working substance can be utilized as a power source for moving the membrane.

Preferably, the permanent magnet is in contact with the high-temperature heat source in the first position and in contact with the low-temperature heat source in the second position, wherein the membrane becomes stabilized in one of the first and second positions of the permanent magnet.

In particular, the first shape, in which heat is transferred from the high-temperature heat source to the enclosed body, can be obtained by one of the stable states of the membrane. Since the permanent magnet is brought into contact with the high-temperature heat source, the heat from the high-temperature heat source is transferred to the working substance so that the working substance causes a phase change of the volume increase. Also, the second shape, in which heat is transferred from the enclosed body to the low-temperature heat source, can be obtained by the other stable state of the membrane. In this case, since the permanent magnet is brought into contact with the low-temperature heat source, the heat is discharged from the working substance to the low-temperature heat source through the permanent magnet so that the working substance causes a phase change of the volume decrease.

The micro power generator further comprises a supporting member, which is coupled to a central portion of the membrane, for supporting the enclosed body with respect to the high-temperature heat source.

Specifically, the enclosed body is supported on the high-temperature heat source by means of the supporting member, which allows the enclosed body to be linearly reciprocated between the high and low-temperature heat sources.

Preferably, the supporting member comprises a thermal insulation material.

Since the supporting member preferably comprises the thermal insulation material, the transferred heat can be prevented from being transferred again from the working substance to the high-temperature heat source through the supporting member.

Preferably, the working substance is a substance, which is easily phase-changeable between a liquid phase and a vapor phase, or between a solid phase and a vapor phase.

As discussed above, the power source of the enclosed body in the micro power generator, which is in accordance with the present invention, can undergo linear reciprocating movement due to the expansion and contraction of the membrane caused by change in the volume of the working substance contained in the enclosed body. Thus, it is preferable that the working substance is an easily phase-changeable substance that can be: boiled from a liquid phase to a vapor phase; sublimated from a solid phase to a vapor phase; condensed from a vapor phase to a liquid phase; or sublimated from a vapor phase to a solid phase.

Preferably, the wire is a coil with multi-layer windings.

In this regard, since the amount of the electric current induced in the coil is proportional to the number of windings, such structure is advantageous for power generation.

According to another aspect of the present invention, there is provided an apparatus for producing reciprocating movement, comprising: a high-temperature heat source; a low-temperature heat source; an enclosed body containing a working substance therein and having a membrane movable in a manner of bi-stable behavior by means of the phase change of a volume increase or a volume decrease of the working substance, the enclosed body being reciprocably movable by a deformation of the membrane between a first position wherein heat can be transferred from the high-temperature heat source and a second position wherein heat can be transferred to the low-temperature heat source; a supporting member coupled to a central portion of the membrane for supporting the enclosed body with respect to the high temperature source; and a member provided at one side of the enclosed body for transferring a reciprocating movement outwardly.

The enclosed body is in contact with the high-temperature heat source in the first position and in contact with the low-temperature heat source in the second position, wherein the membrane is stable in one of the first and second positions.

Preferably, the supporting member comprises a thermal insulation material.

Preferably, the working substance is a substance, which is easily phase-changeable between a liquid phase and a vapor phase, or between a solid phase and a vapor phase.

BRIEF DESCRIPTION OF DRAWINGS

The above objects and features of the present invention will become more apparent from the following description of the preferred embodiments given in conjunction with the accompanying drawings.

DETAILED DESCRIPTION OF THE PRESENT INVENTION

Preferred embodiments of the present invention will now be described in detail with reference to the accompanying drawings.

Figure 1:
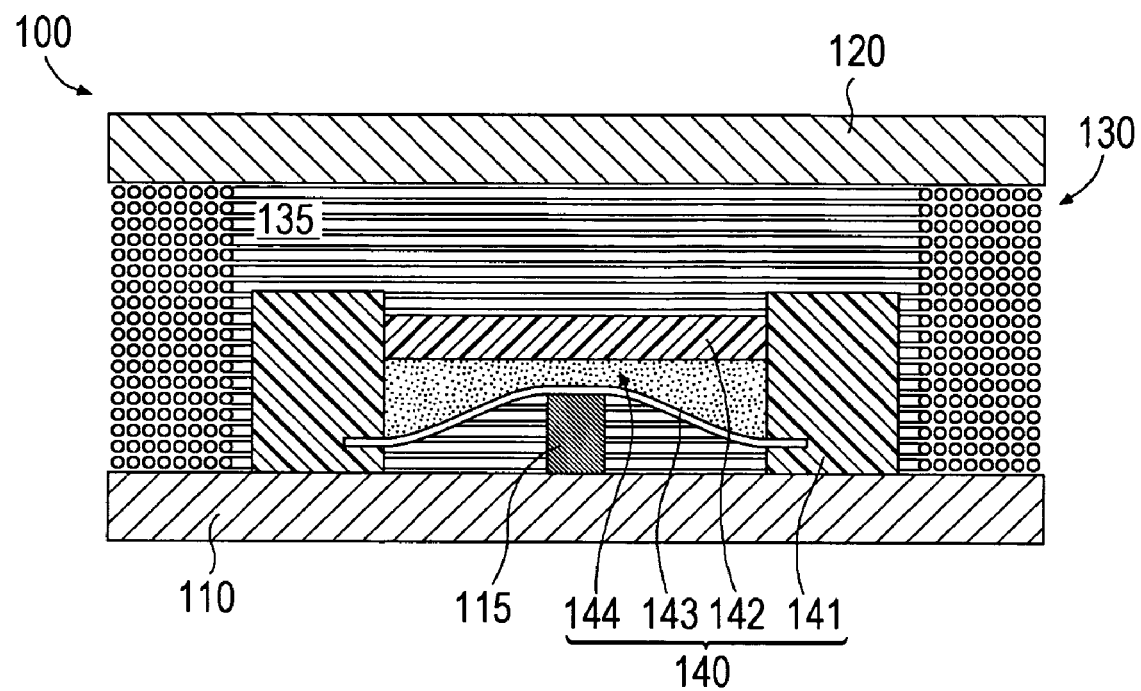
FIG. 1 is a sectional view illustrating a micro power generator constructed in accordance with a preferred embodiment of the present invention.
Figure 2:
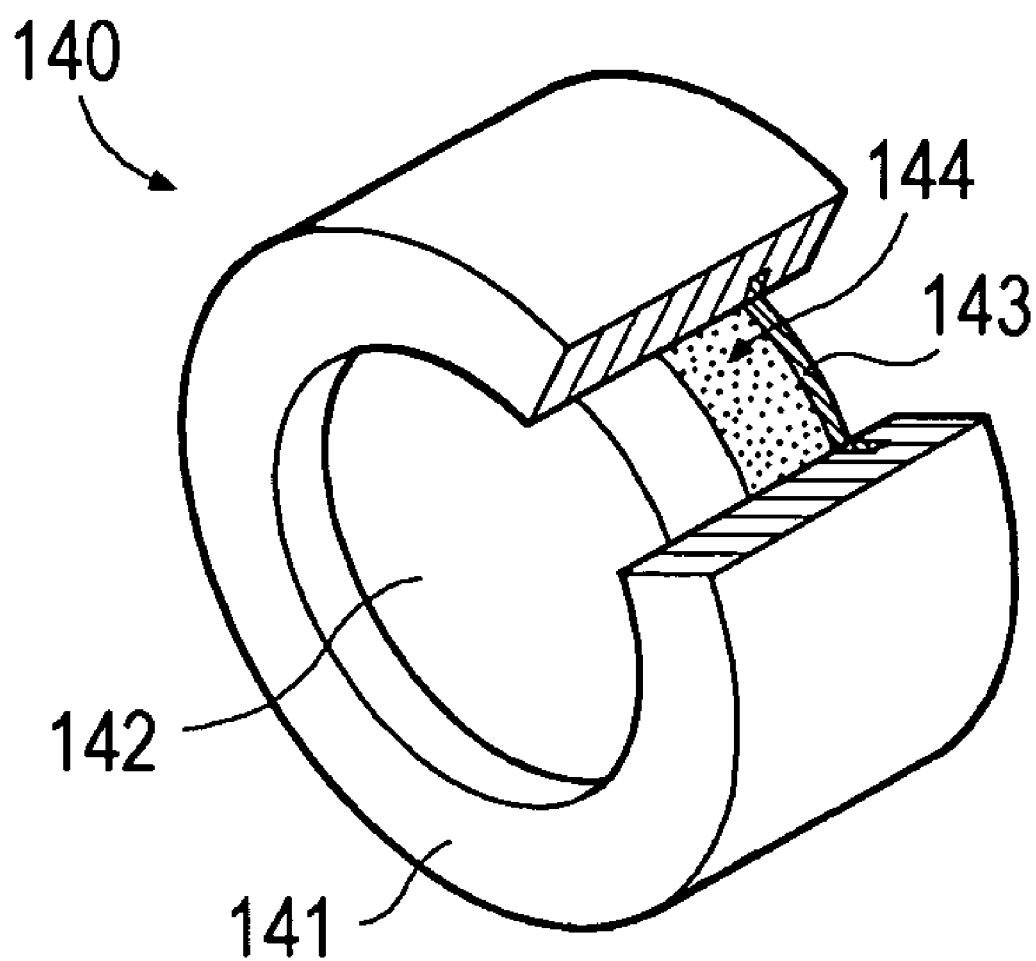
FIG. 2 is a partially cut-away perspective view of an enclosed body shown in FIG. 1.
Figure 3:
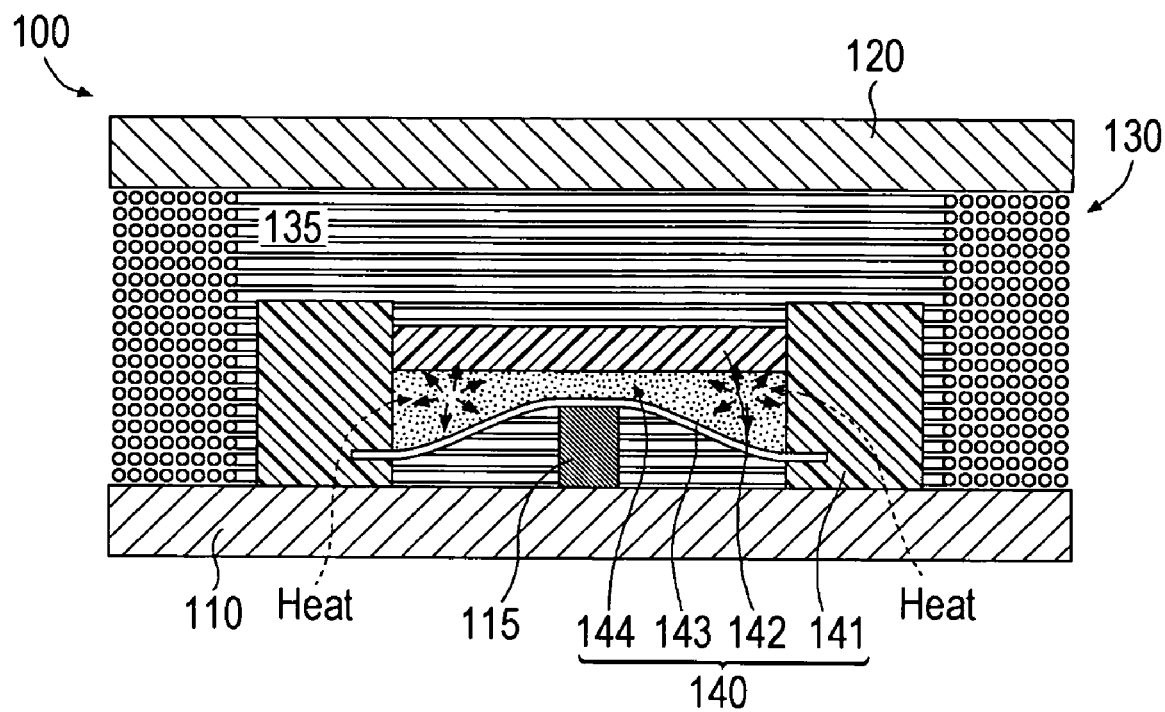
FIG. 3 is a sectional view schematically illustrating a direction of heat transfer and a phase change of a working substance caused by the transferred heat.
Figure 4:
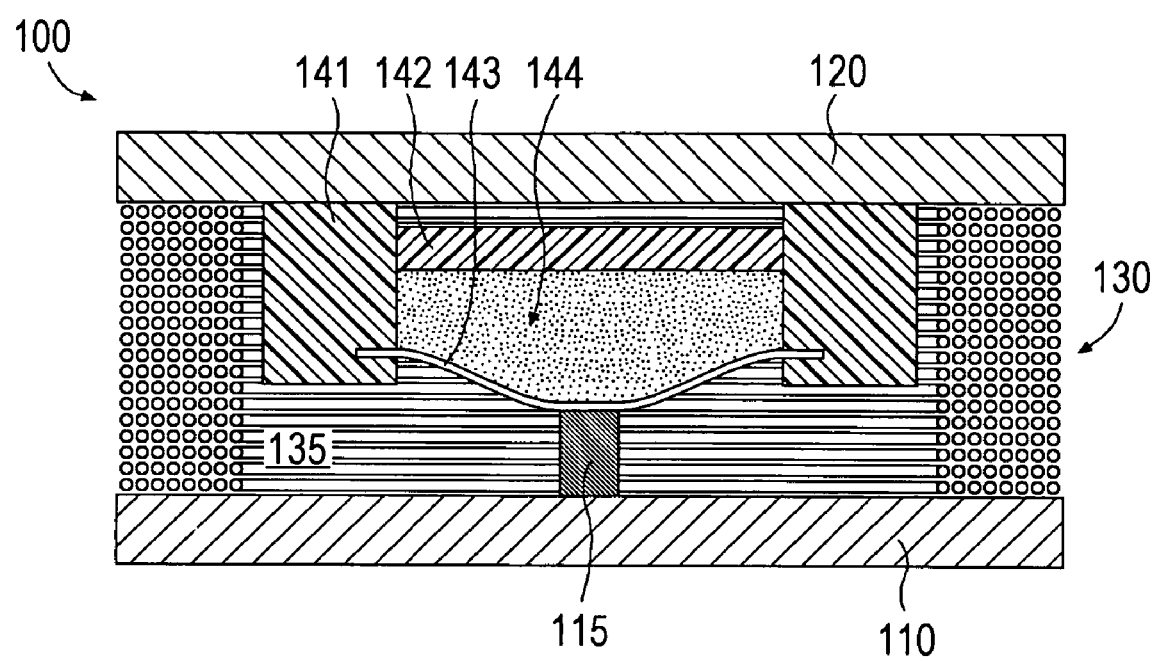
FIG. 4 is a sectional view illustrating a state wherein a permanent magnet is brought into contact with a low-temperature heat source.

FIG. 1 is a sectional view illustrating a micro power generator constructed in accordance with a preferred embodiment of the present invention. FIG. 2 is a partially cut-away perspective view of an enclosed body shown in FIG. 1. FIG. 3 is a sectional view schematically illustrating a direction of heat transfer and a phase change of a working substance caused by the transferred heat. FIG. 4 is a sectional view illustrating a state wherein a permanent magnet is brought into contact with a low-temperature heat source side. In the above drawings, components are denoted by their corresponding reference numerals. It should be noted that the terms "high temperature" and "low temperature", which are used herein to describe the present invention, do not mean a high temperature and a low temperature with respect to a certain absolute temperature. Rather, when there exists a temperature difference between two certain parts, the term "high temperature" is used to refer to one part having a relatively higher temperature, whereas the term "low temperature" is used to refer to the other part having a relatively lower temperature.

Referring now to FIG. 1, a micro power generator 100, which is constructed in accordance with a preferred embodiment of the present invention, comprises: a high-temperature heat source 110; a low-temperature heat source 120; a wire 130 disposed between the high and low-temperature heat sources 110 and 120; an enclosed body 140 containing a working substance 144 therein, which undergoes a phase change of a volume increase at a high temperature and a phase change of a volume decrease at a low temperature, the enclosed body being reciprocally moved along the wire 130 by the expansion or contraction of the working substance 144; and a permanent magnet 141 formed as a part of the enclosed body 140. As mentioned above, there exists a temperature difference between the high-temperature heat source 110 and the low-temperature heat source 120, wherein one having a relatively higher temperature is referred to as "high temperature", and wherein the other having a relatively lower temperature is referred to as "low temperature".

The working substance 144 is expanded due to the phase change (e.g., boiling or evaporation) of the working substance 144, which absorbs heat from the high-temperature heat source 110, and then increases in volume. Such expansion causes the enclosed body 140 and the permanent magnet 141 to be moved toward the low-temperature heat source 120. Such movement changes a magnetic flux density, which causes an electric current to be induced in the wire 130, thereby causing power generation. On the other hand, the working substance 144 is contracted due to the phase change (e.g., condensation or sublimation) of the working substance 144, which decreases in volume after discharging heat into the low-temperature heat source 120 side. Such contraction causes the enclosed body 140 and the permanent magnet 141 to be moved toward the high-temperature heat source 110. This movement causes an electrical current to be induced in the wire 130 as well, thereby causing power generation.

As such, in the micro power generator 100 of the present invention, the wire 130 and the enclosed body 140 having the permanent magnet 141 are positioned between two heat sources (i.e., high and low-temperature heat sources 110 and 120) having a temperature difference therebetween. Further, the enclosed body 140 performs the reciprocating movement between the heat sources with thermal energy based on the temperature difference, thereby causing power generation.

Heat is transferred from the high-temperature heat source 110 into the micro power generator 100. The high-temperature heat source 110 must be maintained at a higher temperature than the low-temperature heat source 120. The high-temperature heat source 110 may comprise a plate, which is fabricated from a metal having a good thermal conductivity. However, the high-temperature heat source 110 is not limited to the plate shape. Thus, it may have any shape suitable for receiving the heat to be transferred from the heat source having high temperature. Further, the material of the high-temperature heat source 110 is not limited to the metal, and any type of material that has a good thermal conductivity can be applied to the high-temperature heat source 110. The plate-shaped high-temperature heat source 110, which is shown in FIG. 1, may be disposed so as to contact the heat source of the high temperature. On the other hand, it may be integrally formed with or partially embedded in the high-temperature surface of any object.

Internal heat of the micro power generator 100 is discharged to the low-temperature heat source 120. The low-temperature heat source 120 must be maintained at a temperature lower than that of the high-temperature heat source 110. The low-temperature heat source 120 may be made from a metal or other material having a good thermal conductivity. It may also have a plate shape or other suitable shape similar to the high-temperature heat source 110. The low-temperature heat source 120 contacts a heat source, for example, external air or shadow, having a temperature lower than that of the high-temperature heat source 110. The heat, which was utilized in the micro power generator 100, is discharged toward the low-temperature heat source 120.

An electrical current is induced in the wire 130, which is positioned between the high-temperature heat source 110 and the low-temperature heat source 120, through the reciprocating movement of the enclosed body 140 (more specifically, the permanent magnet 141). As shown in FIG. 1, it is preferable that the wire 130 is a coil with multi-layer windings. Since the amount of the electrical current induced in the coil is proportional to the number of windings, the number of windings of the coil 130 can vary depending on the applications of the micro power generator 100 of the present invention. As shown in FIG. 1, the enclosed body 140 is reciprocably moved within an inner space 135 of the coil with multi-layer windings and the permanent magnet 141 thereof is also reciprocably moved therein, whereby the surrounding magnetic flux density is changed and the electric current is induced to thereby cause power generation.

The enclosed body 140 will now be described in detail with reference to FIGS. 1 and 2.

As shown in FIG. 2, the enclosed body 140 comprises: a permanent magnet 141 having a cylindrical shape; a thermal insulation plate 142 provided at one end of the permanent magnet 141 for sealing the working substance 144 and providing thermal insulation; a membrane 143 liquid-tightly coupled to the permanent magnet 141 while facing the thermal insulation plate 142, which is movable in a manner of a bi-stable behavior by means of the phase change of the working substance 144; and the working substance 144 disposed in a spaced defined by the permanent magnet 141, the thermal insulation plate 142 and the membrane 143.

The enclosed body 140 can be deformed according to a volume increase or a volume decrease of the working substance 144. However, such deformation is not limited to two stable states. In other words, the enclosed body 140 can be freely deformed according to the volume increase and decrease of the working substance 144 between a first shape (wherein the enclosed body 140 is brought into contact with the high-temperature heat source 110 so that heat is transferred from the high-temperature heat source 110 into the enclosed body 140) and a second shape (wherein the enclosed body 140 is brought into contact with the low-temperature heat source 120 so that heat is discharged from the inside of the enclosed body 140 to the low-temperature heat source 120). Further, the permanent magnet 141, which is provided to the enclosed body 140 so as to constitute a part of the enclosed body 140, is also moved between a first position corresponding to the first shape of the enclosed body 140 and a second position corresponding to the second shape of the enclosed body 140. The movement of the permanent magnet 141, which is caused by the displacement between the first and second positions, changes the magnetic flux density around the wire 130, thereby inducing an electrical current in the wire 130.

The shape of the permanent magnet 141 is not limited to a cylindrical shape as shown in FIG. 2. Rather, the permanent magnet 141 can be implemented as a pair of rod-shaped permanent magnets facing each other. The permanent magnet 141 serves to transfer heat from the high-temperature heat source 110 into the working substance 144 in the first position, wherein the enclosed body 140 is brought into surface-to-surface contact with the high-temperature heat source 110 at the beginning of the reciprocating movement, as shown in FIG. 1. Also, the permanent magnet 141 serves to transfer heat from the working substance 144 to the low-temperature heat source 120 in the second position, wherein the enclosed body 140 is brought into contact with the low-temperature heat source 120 at a turning point of the reciprocating movement, as shown in FIG. 4. Further, the permanent magnet 141 causes an electrical current to be induced in the coil 130 while being reciprocably moved in the inner space 135 of the coil 130. Accordingly, each end portion of the permanent magnet 141, which is brought into contact with the high-temperature heat source 110 or the low-temperature heat source 120, preferably has a flat surface. In addition, the permanent magnet 141 is preferably made from a material having a good thermal conductivity. More preferably, the permanent magnet 141 is positioned so that one end portion thereof can always be brought into surface-to-surface contact with the high-temperature heat source 110 or the low-temperature heat source 120.

The thermal insulation plate 142, which is provided at one end of the permanent magnet 141, serves to define the space filled with the working substance 144, while restricting heat transfer into or from the working substance 144. The thermal insulation plate 142 can be made from a polymeric material or a plastic material having a poor thermal conductivity. As shown in FIG. 2, in case the cylindrical permanent magnet 141 is employed, the thermal insulation plate 142 may also have a circular shape. However, in case that a pair of rod-shaped permanent magnets are symmetrically provided so as to face each other, the thermal insulation plate 142 may be formed as an elongated member having a space in order to contain the working substance as well as to securely connect the permanent magnets to each other.

The membrane 143, which is movable in a manner of the bi-stable behavior, is made from an elastic material or a bucklable material. Accordingly, it can be expanded or contracted depending on the pressure generated inside the working substance 144 by a volume change of the working substance 144. The membrane 143 is centrally coupled to a supporting member 115 provided on the high-temperature heat source 110. The membrane 143 is coupled to the supporting member 115 after being previously deformed or molded so as to allow the enclosed body 140 to be in contact with the high-temperature heat source 110 at the beginning of the reciprocating movement. The membrane 143 may be fabricated from a polymeric material, such as polyethylene terephthalate (PET) or rubber, or a thin metallic material.

Since the membrane 143 is movable in manner of the bi-stable behavior, the membrane 143 can be stabilized in one of two stable states. Further, it can change its shape toward one of the two stable states when it is not in the two stable states.

As for the first shape of the enclosed body 140, the permanent magnet 141 occupies the first position wherein the permanent magnet 141 is brought into contact with the high-temperature heat source 110, during which time the membrane 143 is stable. Then, the phase change of the working substance 144 occurs, wherein the working substance 144 increases in volume due to the heat transferred from the high-temperature heat source 110. As the volume of the working substance 144 increases, the internal pressure of the working substance 144 also increases. When the increased pressure exceeds a certain limit at which the membrane 143 can be buckled, the membrane 143 is expanded by virtue of the increased pressure and is moved so as to take the other stable state.

As for the second shape of the enclosed body 140, the permanent magnet 141 occupies the second position, which is the other stable state of the membrane 143, as mentioned above. In this position, heat is transferred into the low-temperature heat source 120 through the permanent magnet 141 from the working substance 144, the volume of which has been increased by means of the phase change such as boiling or sublimation due to the heat transferred from the high-temperature heat source 110. Then, the heat is discharged from the working substance 144. Thus, the working substance 144 decreases in volume by means of the phase change such as condensation or sublimation, and the internal pressure of the working substance 144 decreases accordingly. When the level of the internal pressure decreases below the buckling limit at which the membrane 143 is caused to be buckled at the high-temperature heat source 110 side, the membrane 143 returns to the stable state of the high-temperature heat source 110 side due to its elasticity.

Accordingly, the membrane 143 becomes stable in one of the two stable states, that is, at the high-temperature heat source 110 side and the low-temperature heat source 120 side. The membrane 143 is deformable toward one of the two stable states when it is located between the high-temperature heat source 110 and the low-temperature heat source 120. Consequently, the enclosed body 140 and the permanent magnet 141 thereof are movable in a manner of the bi-stable behavior wherein they are brought into contact with the high-temperature heat source 110 or the low-temperature heat source 120, respectively. They are then moved toward one of the heat sources when located between the high-temperature heat source 110 and the low-temperature heat source 120. As a result, the enclosed body can perform the reciprocating movement between the high and low-temperature heat sources 110 and 120.

The supporting member 115, which is provided on the high-temperature heat source 110, is coupled to the central portion of the membrane 143 and supports the enclosed body 140. Preferably, the supporting member 115 comprises a thermal insulation material. For example, the supporting member 115 may comprise a polymeric material or a plastic material. However, it should be expressly noted herein that the supporting member 115 is not limited to the above materials. As such, since the supporting member 115 comprises the thermal insulation material, there is an advantage in that the heat, which is transferred from the high-temperature heat source 110 into the working substance 144, can always be smoothly transferred from the high-temperature heat source 110 to the working substance 144 through the permanent magnet 141, while being prevented from flowing again toward the high-temperature heat source 110 through the supporting member 115. In addition, since the supporting member 115 comprises the thermal insulation material, the internal heat of the working substance 144 can be smoothly discharged to the low-temperature heat source 120 through the permanent magnet 141 in the second position, which corresponds to the turning point of the reciprocating movement.

As described above, the working substance 144 is filled or disposed in the space defined by the thermal insulation plate 142, the membrane 143 and the inside of the cylindrical permanent magnet 141. Accordingly, the space of the enclosed body 140 is enclosed and the working substance 144 can be expanded or contracted only toward the elastic membrane 143. Thus, when the working substance 144 contained in the space of the enclosed body 140 undergoes a phase change by means of thermal exchange with its surroundings and increases or decreases in its volume, such expansion or contraction of the working substance 144 can be seen as working toward the outside through the expansion or contraction of the elastic membrane 143.

In other words, as shown in FIG. 3, when heat is transferred from the outside to the working substance 144 (the direction of heat transfer is indicated by arrows in dash), a portion of the working substance 144 is boiled or sublimated and its volume increases as much. As discussed above, the membrane 143 is fabricated from an elastic material having a predetermined buckling limit. Thus, when the internal pressure of the working substance 144, which is contained in the enclosed space, gradually increases and then exceeds the buckling limit of the membrane 143, the membrane 143 is instantaneously buckled and then become rapidly expanded. On the other hand, when the working substance 144, which has expanded the membrane 143 beyond its buckling limit, is cooled down by discharging heat thereof, the portion of the working substance 144 becomes condensed or sublimated and then returns to its original phase. Therefore, the membrane 143, which has been expanded beyond its buckling limit, returns to its original state by virtue of its elasticity.

More specifically, the expansion and contraction of the working substance 144 occur only through the portion of the enclosed body 140, wherein the elastic membrane 143 is positioned. As such, since the membrane 143 and the supporting member 115 are coupled to each other, the expansion and contraction of the working substance 144 cause the enclosed body 140 to be moved in the directions of expansion and contraction of the membrane 143 (i.e., in a reciprocally movable direction in the inner space 135 of the coil). Since such reciprocating movement of the enclosed body 140 (more specifically, the permanent magnet 141 of the enclosed body 140) changes the surrounding magnetic flux density, an electrical current is induced in the coil 130 as a result, thereby causing power generation.

Accordingly, it is preferred that the working substance 144 is easily phase-changeable from a liquid phase to a vapor phase through boiling, or from a solid phase to a vapor phase through sublimation. As discussed above, there can be various examples of high and low-temperature heat sources having a temperature difference therebetween, wherein a power generation structure of the micro power generator 100 of the present invention can be applied. Further, there can be various ranges of their temperature differences as well. Thus, there can be various examples of working substance 144, which can be boiled or sublimated within such temperature differences. For example, if power generation is performed using a temperature difference between a temperature of an external air and a body temperature, the working substance 144 may comprise pentane or HCFC 123 (R123), which is used as a refrigerant for an air conditioner. However, it should be noted herein that these substances are suggested only for illustrative purposes, and the present invention is not limited thereto. In this regard, since the temperature differences, wherein the micro power generator 100 of the present invention may be utilized, have various ranges as described above, the working substance 144 can also vary as much.

The operation of the micro power generator 100, which is constructed in accordance with the above embodiment, will now be described in detail.

In the first step, the enclosed body 140 has the first shape, wherein heat can be transferred thereto from the high-temperature heat source 110. The permanent magnet 141 occupies the first position, wherein the permanent magnet 141 is brought into surface-to-surface contact with the high-temperature heat source 110. Further, the membrane 143 is stable. At this time, heat is transferred from the high-temperature heat source 110 to the working substance 144 through the permanent magnet 141. Also, the working substance 144, which is enclosed by the permanent magnet 141, the thermal insulation plate 142 and the membrane 143, is heated by the transferred heat (see FIG. 3).

In the second step, most of the heat, which is transferred into the working substance 144, is used for the phase change of the working substance 144 from a liquid phase to a vapor phase or from a solid phase to a vapor phase. As a result, the volume of the working substance 144 is increased and its internal pressure is raised accordingly (see FIG. 3).

In the third step, when such internal pressure exceeds a certain limit (e.g., the buckling limit of the membrane 143), the membrane 143 is instantaneously expanded toward a direction without any restriction (e.g., toward the high-temperature heat source 110). Then, the enclosed body 140 is separated from the high-temperature heat source 110 and is moved toward the low-temperature heat source 120.

In the fourth step, while the enclosed body 140 is moved from the high-temperature heat source 110 to the low-temperature heat source 120, the surrounding magnetic flux density is changed by the permanent magnet 141. As a result, an electrical current is induced in the coil 130, thereby causing power generation.

In the next step, the enclosed body 140 has the second shape, wherein the heat contained therein can be transferred to the low-temperature heat source 120. The permanent magnet 141 occupies a second position, wherein the permanent magnet 141 is brought into surface-to-surface contact with the low-temperature heat source 120. Further, the membrane 143 becomes stable. In this case, the above-described procedures are essentially reversed (see FIG. 4). More specifically, when the enclosed body 140 is brought into contact with the low-temperature heat source 120, the heat contained therein is discharged from the high-temperature working substance 144 to the low-temperature heat source 120 through the permanent magnet 141. Then, the portion of the working substance 144 decreases in volume while undergoing a phase change such as condensation from the vapor phase to the liquid phase or sublimation from the vapor phase to the solid phase. Further, when the internal pressure of the working substance 144 is lowered below the certain limit, which keeps the membrane 143 expanded (e.g., the buckling limit of the membrane 143), the elasticity of the membrane 143 works to separate the enclosed body 140 from the low-temperature heat source 120 and allows it to be moved toward the high-temperature heat source 110. In this respect, an electrical current can be induced in the coil 130 by the permanent magnet 141, thereby causing power generation.

As described above, power generation is performed through one movement of the enclosed body 140 from the high-temperature heat source 110 to the low-temperature heat source 120 and the other reverse movement through expansion and contraction of the membrane 143 caused by the volume increase and decrease of the working substance 144. These movements can make one cycle of power generation of the micro power generator. In addition, when the enclosed body 140 is once again brought into contact with the high-temperature heat source 110, the micro power generator 100 returns to the above-described first step. Therefore, electricity can be continuously generated.

Figure 5:
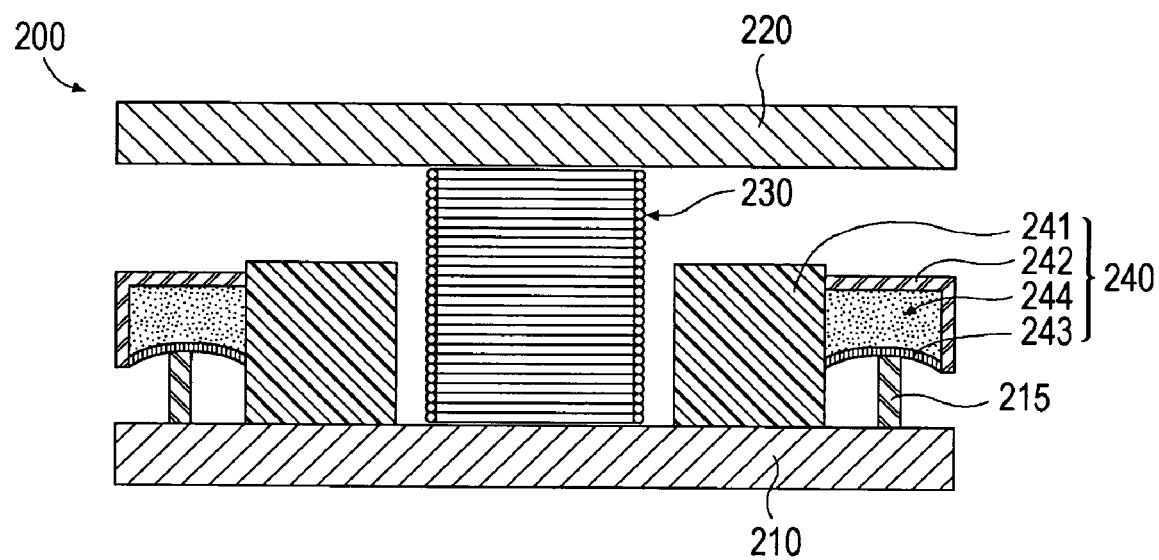
FIG. 5 is a sectional view illustrating a micro power generator constructed in accordance with another preferred embodiment of the present invention.
Figure 6:
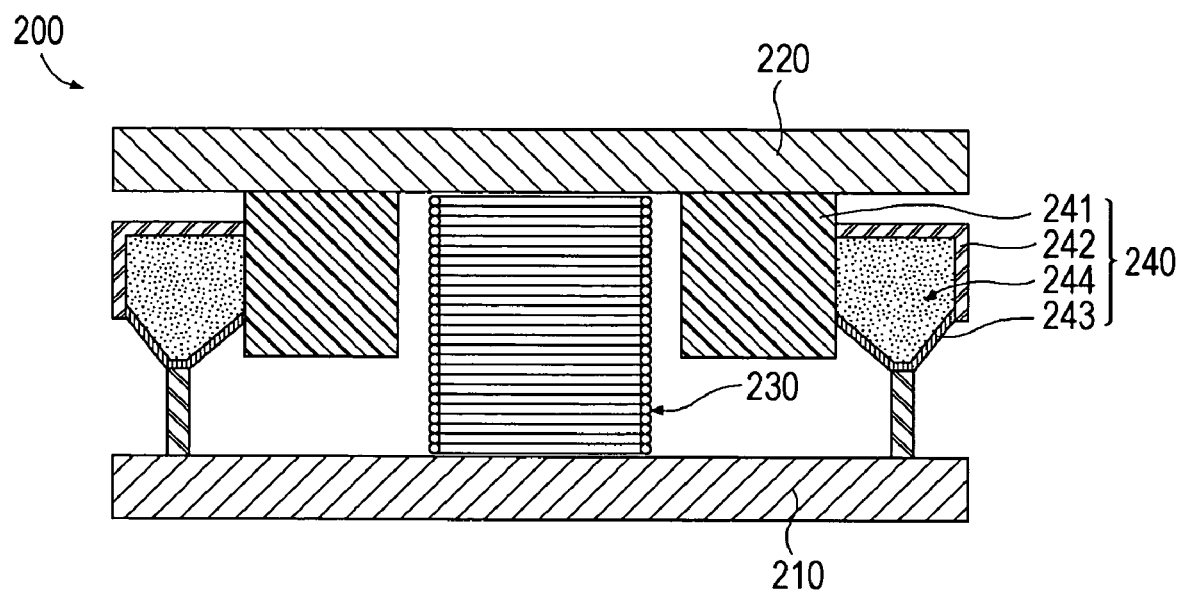
FIG. 6 is a sectional view illustrating a state wherein a permanent magnet is brought into contact with a low-temperature heat source in the micro power generator of FIG. 5.

FIGS. 5 and 6 illustrate a micro power generator constructed in accordance with another preferred embodiment of the present invention. The micro power generator 200 of the present embodiment has the same configuration and functions as the micro power generator 100 described with reference to FIGS. 1 to 4, with the exception of the following: a wire (e.g., a coil 230) is centrally positioned between a high-temperature heat source 210 and a low-temperature heat source 220; a permanent magnet 241 surrounding the coil 230 is reciprocably moved along the coil 230; and a supporting member 215, a membrane 243 and a thermal insulation plate 242 are correspondingly modified.

The permanent magnet 241 may have a cylindrical shape (as shown in FIG. 2) or a rod shape. If the permanent magnet 241 has a rod shape, then an additional member for connecting permanent magnets may be required. The thermal insulation plate 242 may have an L-shaped cross-section so that it can support the permanent magnet 241 and contain a working substance 244 therein. If the permanent magnet 241 has a cylindrical shape, then the thermal insulation plate 242 may have an annular shape. The working substance 244 is contained in a space defined by the permanent magnet 241 and the thermal insulation plate 242. The membrane 243, which encloses the working substance 244 in the space and enables the working substance 244 to be expanded or contracted in only one direction, may be provided so as to be suitable for the shapes of the permanent magnet 241 and the thermal insulation plate 242.

The micro power generator 100 or 200 of the present invention is not required to operate only when the high-temperature heat source 110 or 210 is arranged downward and the low-temperature heat source 120 or 220 is arranged upward, as shown in the drawings. For example, the micro power generator 100 or 200 of the present invention may be used with horizontal or inverted arrangement. This is because the elastic membrane 143 or 243 guarantees the returning movement of the enclosed body 140 or 240.

Further, the structure of the enclosed body 100 or 200, which is employed in the present invention, is not limited to power generation. For example, if the coil 130 or 230 is omitted and any other member, which has the same shape as the permanent magnet 141 or 241 and is made from a good thermal conductivity material, is employed instead of the permanent magnet 141 or 241, such a modified structure can also effectuate a reciprocating movement. That is, such a modified structure may be employed for an apparatus for producing reciprocating movement. Further, when a bar-shaped member for transferring reciprocating movement outwardly is provided at one end of the reciprocably movable enclosed body so as to be reciprocably moved together with the enclosed body and another bar-shaped member that can be connected to a rotational shaft is pivotively jointed to the other end of the bar-shaped transferring member, the reciprocating movement of the enclosed body can be converted into revolution of the rotational shaft. Consequently, the above-mentioned apparatus, which comprises said modified structure, may be used as a novel apparatus for producing reciprocating movements or a novel power source.

As described above, according to the micro power generator of the present invention, when heat is transferred between two heat sources, which have a temperature difference therebetween, the working substance causes the permanent magnet to be reciprocably moved between the two heat sources while being expanded by the heat transferred thereto or contracted by the heat discharged therefrom. Such reciprocating movements change the magnetic flux density around the coil, thereby inducing an electric current in the coil. Accordingly, there may be provided the micro power generator wherein thermal energy based on the temperature difference between two heat sources can be converted into electric energy, the efficiency and amount of power generation are enhanced, and the temperature range for operation is increased.

From the macro-scale perspective, the micro power generator of the present invention can be utilized as a generator for recovering wasted heat in a power plant, a chemical plant, an incinerating facility, etc. From the micro-scale perspective, it can be utilized as a main or auxiliary power source for MEMS, cell phones, PDAs, notebook computers, DNA chips, etc., through using a body temperature, a solar heat, and the like as a thermal energy source.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A micro power generator, comprising:
    a high-temperature heat source;
    a low-temperature heat source;
    an enclosed body containing a working substance therein, the enclosed body being deformable by means of a phase change of the working substance between a first shape wherein heat can be transferred from the high-temperature heat source and a second shape wherein heat can be transferred to the low-temperature heat source;
    a permanent magnet constituting the enclosed body, the permanent magnet being maintained in a first position when the enclosed body has the first shape and in a second position when the enclosed body has the second shape; and
    a wire in which an electric current is induced by a movement of the permanent magnet, wherein the enclosed body comprises a membrane movable in a manner of a bi-stable behavior, the membrane being liquid-tightly coupled to the permanent magnet, and
    wherein the micro power generator further comprises a supporting member coupled to a central portion of the membrane for supporting the enclosed body with respect to the high-temperature heat source.

2. The micro power generator of claim 1, wherein the bi-stable behavior of the membrane is made by means of the phase change of a volume increase or a volume decrease of the working substance.

3. The micro power generator of claim 2, wherein the permanent magnet is in contact with the high-temperature heat source in the first position, and wherein the permanent magnet is in contact with the low-temperature heat source in the second position, and wherein the membrane is stable in one of the first and second positions of the permanent magnet.

4. The micro power generator of claim 1, wherein the supporting member comprises a thermal insulation material.

5. The micro power generator of claim 1, wherein the working substance is a phase-changeable substance between a liquid phase and a vapor phase.

6. The micro power generator of claim 1, wherein the working substance is a phase-changeable substance between a solid phase and a vapor phase.

7. The micro power generator of claim 1, wherein the wire is a coil with multi-layer windings.

8. An apparatus for producing a reciprocating movement, comprising:
    a high-temperature heat source;
    a low-temperature heat source;
    an enclosed body containing a working substance therein and having a membrane movable in a manner of a bi-stable behavior by means of a phase change of a volume increase or a volume decrease of the working substance, the enclosed body being reciprocably moved by a deformation of the membrane between a first position wherein heat can be transferred from the high-temperature heat source and a second position wherein heat can be transferred to the low-temperature heat source;

a supporting member coupled to a central portion of the membrane for supporting the enclosed body with respect to the high temperature source;

and a member provided at one side of the enclosed body for transferring the reciprocating movement outwardly.

9. The apparatus of claim 8, wherein the enclosed body is in contact with the high-temperature heat source in the first position, and wherein the enclosed body is in contact with the low-temperature heat source in the second position, and wherein the membrane is stable in one of the first and second positions.

10. The apparatus of claim 8, wherein the supporting member comprises a thermal insulation material.

11. The apparatus of claim 8, wherein the working substance is a phase-changeable substance between a liquid phase and a vapor phase.

12. The apparatus of claim 8, wherein the working substance is a phase-changeable substance between a solid phase and a vapor phase.

* * * * *